United States Patent
Wang et al.

(10) Patent No.: US 9,107,304 B2
(45) Date of Patent: Aug. 11, 2015

(54) FABRICATION OF THREE-DIMENSIONAL PRINTED CIRCUIT BOARD STRUCTURES

(75) Inventors: Nigel Wang, Shang Hai (CN); Orville Nyhus, Glendale, AZ (US)

(73) Assignee: Honeywell International Inc., Morristown, NJ (US)

( * ) Notice: Subject to any disclaimer, the term of this patent is extended or adjusted under 35 U.S.C. 154(b) by 26 days.

(21) Appl. No.: 13/508,257

(22) PCT Filed: Nov. 18, 2011

(86) PCT No.: PCT/CN2011/082471
§ 371 (c)(1),
(2), (4) Date: May 4, 2012

(87) PCT Pub. No.: WO2013/071519
PCT Pub. Date: May 23, 2013

(65) Prior Publication Data
US 2014/0238724 A1  Aug. 28, 2014

(51) Int. Cl.
| H05K 1/16 | (2006.01) |
| H05K 1/02 | (2006.01) |
| H05K 3/36 | (2006.01) |
| H05K 1/11 | (2006.01) |
| H05K 3/00 | (2006.01) |

(52) U.S. Cl.
CPC ............. *H05K 1/0284* (2013.01); *H05K 1/119* (2013.01); *H05K 3/36* (2013.01); *H05K 3/0044* (2013.01); *H05K 2201/09163* (2013.01); *H05K 2201/2072* (2013.01); *Y10T 29/49124* (2015.01); *Y10T 29/49126* (2015.01)

(58) Field of Classification Search
CPC ....... H05K 1/0284; H05K 1/119; H05K 3/36; H05K 3/0044; H05K 2201/09163; H05K 2201/2072; Y10T 29/49124; Y10T 29/49126

USPC .................................. 29/825, 830, 842, 846
See application file for complete search history.

(56) References Cited

U.S. PATENT DOCUMENTS

| 4,924,152 | A | | 5/1990 | Flickinger |
| 5,008,496 | A | | 4/1991 | Schmidt et al. |
| 5,179,601 | A | * | 1/1993 | Gotoh et al. ..................... 385/14 |
| 5,243,130 | A | * | 9/1993 | Kitagawa ......................... 174/50 |
| 5,264,061 | A | | 11/1993 | Juskey et al. |
| 6,032,357 | A | * | 3/2000 | Wojewnik ........................ 29/846 |
| 6,137,691 | A | * | 10/2000 | Jang .............................. 361/784 |
| 6,356,243 | B1 | | 3/2002 | Schneider et al. |

(Continued)

*Primary Examiner* — Carl Arbes
(74) *Attorney, Agent, or Firm* — Fogg & Powers LLC

(57) ABSTRACT

A method of fabricating components for a three-dimensional circuit structure includes providing a printed circuit board (PCB) having a top surface, an opposing bottom surface, and an end section. A first angled channel is formed in the top surface at the end section, with the first angled channel extending to an edge of the end section and dividing the end section into a first end portion and a second end portion. The PCB material is removed from the top surface at the first end portion to form a first support member having an upper surface at a preselected distance below the top surface. A second angled channel is formed in the bottom surface at the end section of the first PCB, with the second angled channel extending to the edge of the end section and being adjacent to the first support member. The PCB material is removed from the bottom surface at the second end portion to form a second support member having an upper surface that is contiguous with the top surface of the PCB. A ramp portion extends between the first support member and the second support member.

14 Claims, 3 Drawing Sheets

(56) References Cited

U.S. PATENT DOCUMENTS

| | | | |
|---|---|---|---|
| 6,521,830 B1 * | 2/2003 | Platz | 174/50 |
| 7,333,147 B2 | 2/2008 | Adachi et al. | |
| 2003/0036790 A1 * | 2/2003 | Corbett et al. | 607/137 |
| 2007/0062727 A1 | 3/2007 | Braman et al. | |
| 2008/0099232 A1 | 5/2008 | Mayder | |
| 2008/0244898 A1 * | 10/2008 | Shacklette et al. | 29/830 |
| 2010/0006327 A1 | 1/2010 | Yu et al. | |

* cited by examiner

FABRICATION OF THREE-DIMENSIONAL PRINTED CIRCUIT BOARD STRUCTURES

BACKGROUND

The structure of radio frequency (RF) system products has become more complex in recent years. For example, three-dimensional structural designs for RF systems have become more common. In specific cases, circuit components are designed in three dimensions, such that the circuit is not contained in a common plane, to meet special requirements.

Generally, providing a three-dimensional circuit connection between different printed circuit boards would be a typical application, especially for common vertical connections, such as orienting two printed circuit boards at any angle with respect to each other. This is easier to accomplish for an orthogonal connection because the printed circuit board can more easily be made with an orthogonal cut on an edge of the board. However, newer three-dimensional circuit designs need printed circuit boards at an angle that is not at 90 degrees. In particular cases for which an angle of 45 degrees is needed, a 45 degree milled slot in the board is difficult and costly to manufacture using standard printed circuit board manufacturing techniques.

SUMMARY

A method of fabricating components for a three-dimensional circuit structure includes providing a printed circuit board (PCB) having a top surface, an opposing bottom surface, and an end section. A first angled channel is formed in the top surface at the end section, with the first angled channel extending to an edge of the end section and dividing the end section into a first end portion and a second end portion. The PCB material is removed from the top surface at the first end portion to form a first support member having an upper surface at a preselected distance below the top surface. A second angled channel is formed in the bottom surface at the end section of the first PCB, with the second angled channel extending to the edge of the end section and being adjacent to the first support member. The PCB material is removed from the bottom surface at the second end portion to form a second support member having an upper surface that is contiguous with the top surface of the PCB. A ramp portion extends between the first support member and the second support member.

BRIEF DESCRIPTION OF THE DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which.

DETAILED DESCRIPTION

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

A method for manufacturing and assembling a three-dimensional circuit structure such as a three-dimensional printed circuit board (PCB) structure is provided.

For some applications, a connection between a PCB and another PCB or other part is not orthogonal but requires some specific angle that is smaller or larger than 90 degrees. In some implementations, additional mechanical parts or connectors are employed, which makes the system more complex with higher cost and reduced reliability.

Cutting on the edge of a PCB is generally prohibited because of the mechanical strength of the PCB material and its multi-layer anisotropy. The PCB material is easily damaged during a milling process along the edge of the PCB. In addition, for each angle, a 90 degree rotation would be required to make the cut, making the whole process very complex with high cost and low efficiency. While a milling head positioned at a 45 degree angle can be used in such a process, it is not part of the standard PCB production techniques and requires a special milling head/machine. At the same time, a filleted corner is difficult to avoid using such a special milling head/machine.

The present method provides for making an arbitrary angle for a three-dimensional connection between a PCB and another PCB or other electronic part using general PCB manufacturing techniques. The present approach can be used to simplify the assembly of electronic components, such as those used in navigation receivers.

Further details with respect to the present method are described as follows with reference to the drawings.

Figure 1A:
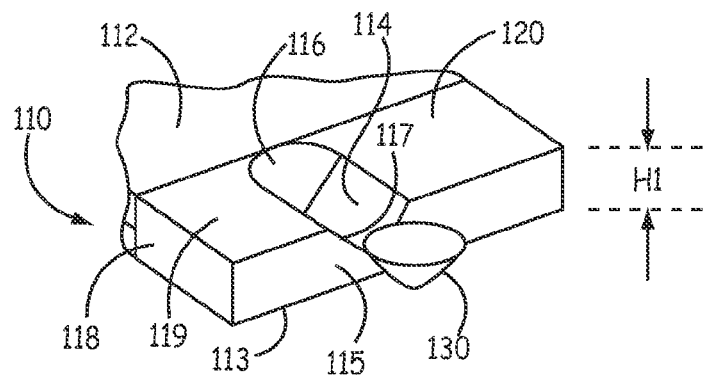
FIGS. 1A-1E are partial perspective views showing various manufacturing stages for producing a component of a three-dimensional printed circuit board structure according to one embodiment.

FIGS. 1A-1E depict various manufacturing stages for fabricating a component of a three-dimensional printed circuit board structure according to one embodiment. As shown in FIG. 1A, a first PCB 110 is provided having a top surface 112, an opposing bottom surface 113, and a first height H1. A first angled channel 114 having a slope with a desired angle is formed in top surface 112 of PCB 110. In one approach, the channel 114 can be formed by cutting through top surface 112 with a conical milling head 130 toward an edge 115. This results in channel 114 having a conical section 116 and a V-shaped section 117 extending from conical section 116 to edge 115. The channel 114 divides an end section 118 of PCB 110 into a first end portion 119 and a second end portion 120.

Figure 1B:
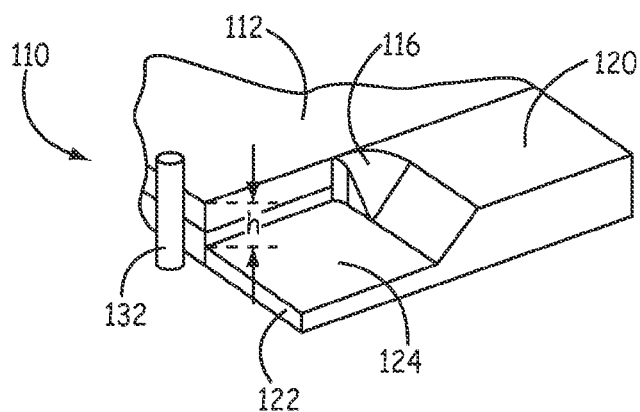
Figure 1C:
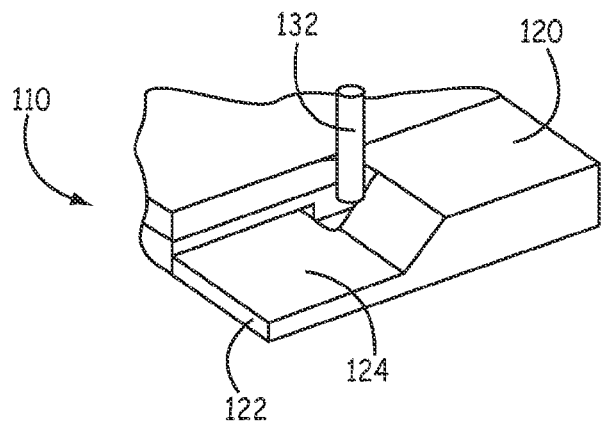

As illustrated in FIG. 1B, a portion of PCB material on end portion 119 is removed a preselected distance h below top surface 112 of PCB 110 to form a first support member 122 having an upper surface 124. In one approach, the first support member 122 can be formed by milling through top surface 112 with a mill head 132. The remaining PCB material defining conical section 116 is then removed, such as by milling the material with mill head 132 as shown in FIG. 1C.

Figure 1D:
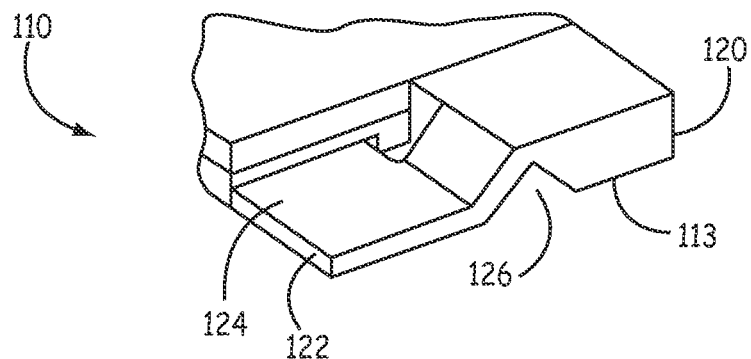

The foregoing operations are then repeated on the inverse side of PCB 110. As depicted in FIG. 1D, a second angled channel 126 having a slope with a desired angle is formed in bottom surface 113 at second end portion 120 of end section 118. The channel 126 can be formed with the same conical milling head 130 as used to form channel 114 such that channel 126 has the same shape and size as channel 114. The channel 126 extends to edge 115 at end section 118 and is adjacent to first support member 122.

Figure 1E:
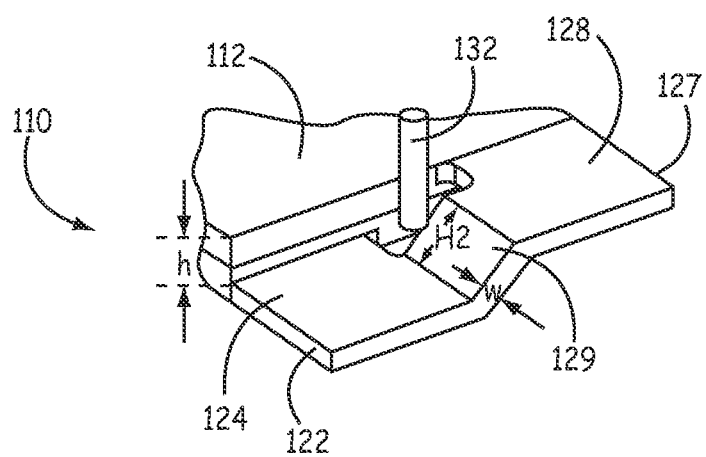

As shown in FIG. 1E, a portion of PCB material on end portion 120 is removed a preselected distance from bottom surface 113 of PCB 110 to form a second support member 127 having an upper surface 128 that is contiguous with top surface 112 of the PCB 110. This leaves a ramp portion 129 that extends between first and second support member 122 and 127. The ramp portion 129 has a thickness w, and a length H2 between first and second support member 122 and 127. The second support member 127 can be formed such as by milling through the inverse side of PCB 110 into end portion 120 with mill head 132. Any remaining redundant material from forming channel 126 can be then removed, such as by milling with mill head 132.

Figure 2:
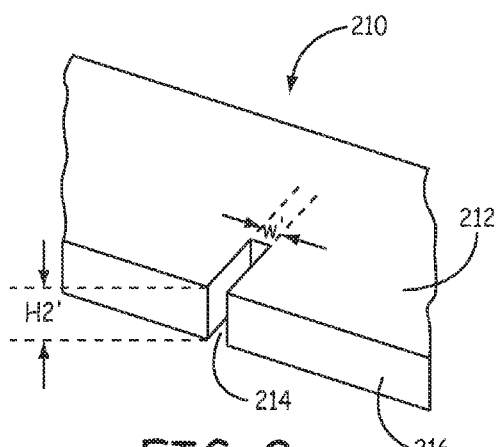
FIG. 2 is a partial perspective view of a manufacturing stage for producing another component of a three-dimensional printed circuit board structure according to one embodiment.

FIG. 2 illustrates a further manufacturing stage for fabricating a component of a three-dimensional printed circuit board structure according to one embodiment. As shown in FIG. 2, a second PCB 210 is provided having a top surface 212 and a height H2' that corresponds with the length H2 between first and second support members 122 and 127 of PCB 110. A vertical slot 214 is formed through upper surface 212 and extends to an edge 216 of PCB 210. The vertical slot 214 has a size and shape that corresponds to the size and shape of ramp portion 129. For example, vertical slot 214 has a width w' that corresponds with the thickness w of ramp portion 129, and a height H2' that corresponds with the length H2 of ramp portion 129 between first and second support members 122 and 127. In alternative embodiments, PCB 210 can be replaced with other circuit components as needed for a desired configuration. A similar vertical slot is formed in such circuit components as described above.

Figure 3A:
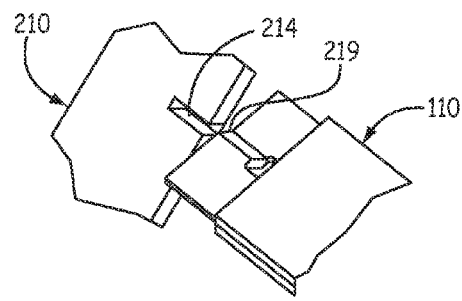
FIGS. 3A-3C are partial perspective views showing various assembly stages in the fabrication of a three-dimensional printed circuit board structure according to one embodiment.
Figure 3B:
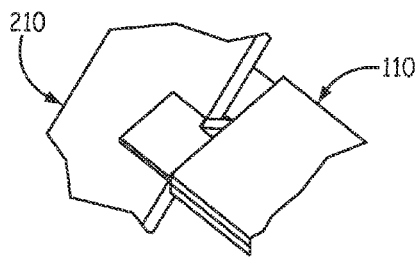
Figure 3C:
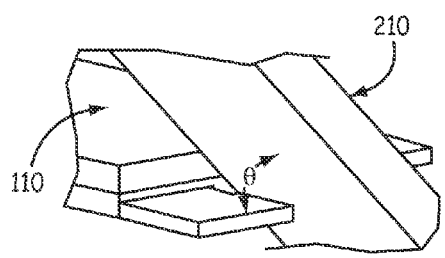

FIGS. 3A-3C show various assembling stages in the production of a three-dimensional printed circuit board structure according to one embodiment. As depicted in FIG. 3A, ramp portion 129 of PCB 110 is aligned with vertical slot 214 of PCB 210 or another circuit component. The PCB 110 is connected to PCB 210 (or other component) by inserting ramp portion 129 into slot 214 as shown in FIG. 3B. The PCB 110 and PCB 210 are connected mechanically and electrically at an included angle θ as illustrated in FIG. 3C.

With the included angle being θ, the following formula can be utilized to design a three-dimensional printed circuit board structure as described above:

$$h = H_2 \sin\theta$$
$$w = \frac{H_1 - H_2 \sin\theta}{\cos\theta}$$

where h is the height of the material removed from the first PCB;
w is the width of the vertical slot on the second PCB;
H1 is the total height (thickness) of the first PCB; and
H2 is the total height (thickness) of the second PCB.

All of the foregoing manufacturing procedures are based on general PCB processes, and thus no special rotation operations are required. Each operation can be finished on the top or bottom side of the PCB, which is useful in mass production. The electronic connections can be accomplished by metal plating on the PCB. Metal plating on the ramp portion can be employed to get the best connections, such as providing for easier soldering.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. A method of fabricating components for a three-dimensional circuit structure, the method comprising:
providing a first printed circuit board (PCB) having a top surface, an opposing bottom surface, a first height, and an end section;
forming a first angled channel in the top surface at the end section of the first PCB, wherein the first angled channel extends to an edge of the end section and divides the end section into a first end portion and a second end portion;
removing PCB material from the top surface at the first end portion to form a first support member having an upper surface at a preselected distance below the top surface;
forming a second angled channel in the bottom surface at the end section of the first PCB, wherein the second angled channel extends to the edge of the end section and is adjacent to the first support member; and
removing PCB material from the bottom surface at the second end portion to form a second support member having an upper surface that is contiguous with the top surface of the first PCB, wherein a ramp portion extends between the first support member and the second support member, the ramp portion having a first size and shape.

2. The method of claim 1, further comprising:
providing a circuit component having a second height; and
forming a vertical slot through the second circuit component that extends to an edge of the second circuit component, wherein the vertical slot has a second size and shape that corresponds to the first size and shape of the ramp portion.

3. The method of claim 1, wherein the second angled channel has the same size and shape as the first angled channel.

4. The method of claim 2, wherein the circuit component comprises a second PCB.

5. The method of claim 4, wherein the height of the second PCB is the same as the height of the first PCB.

6. The method of claim 2, wherein the vertical slot has a width that corresponds with a thickness of the ramp portion.

7. The method of claim 1, wherein the first angled channel is formed with a conical mill head.

8. The method of claim 7, wherein the second angled channel is formed with the conical mill head.

9. A method of fabricating a three-dimensional printed circuit board structure, the method comprising:
providing a first printed circuit board (PCB) having a top surface, an opposing bottom surface, a first height, and an end section;
forming a first angled channel in the top surface at the end section of the first PCB, wherein the first angled channel extends to an edge of the end section and divides the end section into a first end portion and a second end portion;
removing PCB material from the top surface at the first end portion to form a first support member having an upper surface at a preselected distance below the top surface;
forming a second angled channel in the bottom surface at the end section of the first PCB, wherein the second angled channel extends to the edge of the end section and is adjacent to the first support member;
removing PCB material from the bottom surface at the second end portion to form a second support member having an upper surface that is contiguous with the top surface of the first PCB, wherein a ramp portion extends between the first support member and the second support member, the ramp portion having a first size and shape;

providing a second PCB having a second height;

forming a vertical slot through the second PCB that extends to an edge of the second PCB, wherein the vertical slot has a second size and shape that corresponds to the first size and shape of the ramp portion;

inserting the ramp portion of the first PCB into the vertical slot of the second PCB; and securing the first PCB to the second PCB at a preselected angle.

10. The method of claim 9, wherein the second angled channel has the same shape and size as the first angled channel.

11. The method of claim 9, wherein the height of the second PCB is the same as the height of the first PCB.

12. The method of claim 9, wherein the vertical slot has a width that corresponds with a thickness of the ramp portion.

13. The method of claim 9, wherein the first angled channel is formed with a conical mill head.

14. The method of claim 13, wherein the second angled channel is formed with the conical mill head.

* * * * *